(12) United States Patent
Hematy et al.

(10) Patent No.: US 11,342,894 B2
(45) Date of Patent: May 24, 2022

(54) DRIVER CIRCUITRY AND ASSOCIATED METHODS

(71) Applicant: Maxim Integrated Products, Inc., San Jose, CA (US)

(72) Inventors: Arman Hematy, San Jose, CA (US); Kenneth Jay Helfrich, Gainesville, GA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 16/687,985

(22) Filed: Nov. 19, 2019

(65) Prior Publication Data

US 2020/0159268 A1    May 21, 2020

Related U.S. Application Data

(60) Provisional application No. 62/769,431, filed on Nov. 19, 2018.

(51) Int. Cl.
*H03G 3/00*     (2006.01)

(52) U.S. Cl.
CPC .................................. *H03G 3/004* (2013.01)

(58) Field of Classification Search
CPC ..................................................... H03G 3/004
See application file for complete search history.

(56) References Cited

U.S. PATENT DOCUMENTS

| 5,631,550 | A | | 5/1997 | Castro et al. |
| 6,157,093 | A | | 12/2000 | Giannopoulos et al. |
| 6,788,151 | B2 | * | 9/2004 | Shvarts .................... H03F 1/025 330/127 |
| 7,298,214 | B2 | * | 11/2007 | Lee .......................... H02M 3/07 330/136 |
| 7,474,157 | B2 | * | 1/2009 | Lo ........................... H03F 1/0211 330/127 |
| 7,808,324 | B1 | * | 10/2010 | Woodford ................ H03F 3/185 330/296 |
| 8,000,665 | B2 | * | 8/2011 | Stebbings ............. H04L 27/368 455/127.5 |
| 8,385,464 | B2 | * | 2/2013 | Liang ..................... H03F 1/3241 375/296 |
| 8,446,219 | B2 | * | 5/2013 | Mohajeri ................ H03F 1/025 330/136 |
| 8,461,928 | B2 | * | 6/2013 | Yahav .................... H03G 3/007 330/279 |

(Continued)

OTHER PUBLICATIONS

John Ardizzoni, Is amplifier headroom cramping your style?, Oct. 2010, Analog Devices, Inc., Analog Dialogue Issue #62, https://www.analog.com/en/analog-dialogue/raqs/raq-issue-62.html accessed Oct. 23, 2020 (Year: 2010).*

*Primary Examiner* — Thomas J. Hiltunen
(74) *Attorney, Agent, or Firm* — Lathrop GPM LLP

(57) ABSTRACT

A method for using driver circuitry to drive a load having an unknown impedance magnitude includes (a) in a configuration mode of the driver circuitry, determining a required power supply voltage for a driver stage to drive the load, and (b) in a driving mode of the driver circuitry, (1) driving the load via the driver stage in response to an input signal, and (2) controlling a power supply to provide the required power supply voltage to the driver stage as a static voltage, while driving the load via the driver stage in response to the input signal.

16 Claims, 11 Drawing Sheets

(56) References Cited

U.S. PATENT DOCUMENTS

| | | | | |
|---|---|---|---|---|
| 8,659,355 | B2* | 2/2014 | Henshaw | H03F 1/0227 |
| | | | | 330/127 |
| 8,841,967 | B2* | 9/2014 | Drogi | H03F 1/0227 |
| | | | | 330/136 |
| 9,007,126 | B2* | 4/2015 | Langer | H03G 3/3042 |
| | | | | 330/127 |
| 9,190,986 | B1* | 11/2015 | Peng | H05B 45/50 |
| 9,319,495 | B2* | 4/2016 | D'Souza | H03F 3/68 |
| 9,479,868 | B2* | 10/2016 | Ilango | G10K 11/17881 |
| 9,794,884 | B2* | 10/2017 | Drogi | H04B 1/04 |
| 10,110,168 | B2* | 10/2018 | Soliman | H03F 1/0266 |
| 10,201,049 | B1 | 2/2019 | Xie et al. | |
| 10,243,524 | B2* | 3/2019 | Orr | H02M 3/1582 |
| 10,278,242 | B2 | 4/2019 | Wang et al. | |
| 10,420,179 | B1* | 9/2019 | Chen | H05B 45/37 |
| 10,454,432 | B2* | 10/2019 | Soliman | H03L 7/24 |
| 10,749,477 | B2* | 8/2020 | Duncan | H03F 3/68 |
| 2004/0006484 | A1* | 1/2004 | Manis | H04H 60/95 |
| | | | | 704/500 |
| 2005/0242880 | A1* | 11/2005 | Domokos | H03G 3/004 |
| | | | | 330/280 |

* cited by examiner

DRIVER CIRCUITRY AND ASSOCIATED METHODS

RELATED APPLICATIONS

This application claims benefit of priority to U.S. Provisional Patent Application Ser. No. 62/769,431, filed on Nov. 19, 2018, which is incorporated herein by reference.

BACKGROUND

Many electronic devices have input and output ports for communicating with other devices. For example, a microprocessor typically has numerous input and output ports for communicating with external devices, such as with memory devices. Electronic device output ports, however, typically have a limited voltage and current driving capability. Consequently, electronic devices are often incapable of directly driving loads having a low impedance magnitude and/or loads requiring a high voltage. For example, a microprocessor output port may be incapable of driving a load having a low-impedance, and a digital-to-analog converter (DAC) output port may be incapable of driving a load having a low-impedance.

Driver circuitry may be used to extend the capability of an electronic device to drive a load. For example, driver circuitry may be used to interface a DAC output port having limited output current capability with a low-impedance load. The driver circuitry effectively amplifies an output signal from the DAC output port for driving the low-impedance load.

DETAILED DESCRIPTION OF THE EMBODIMENTS

Figure 1:
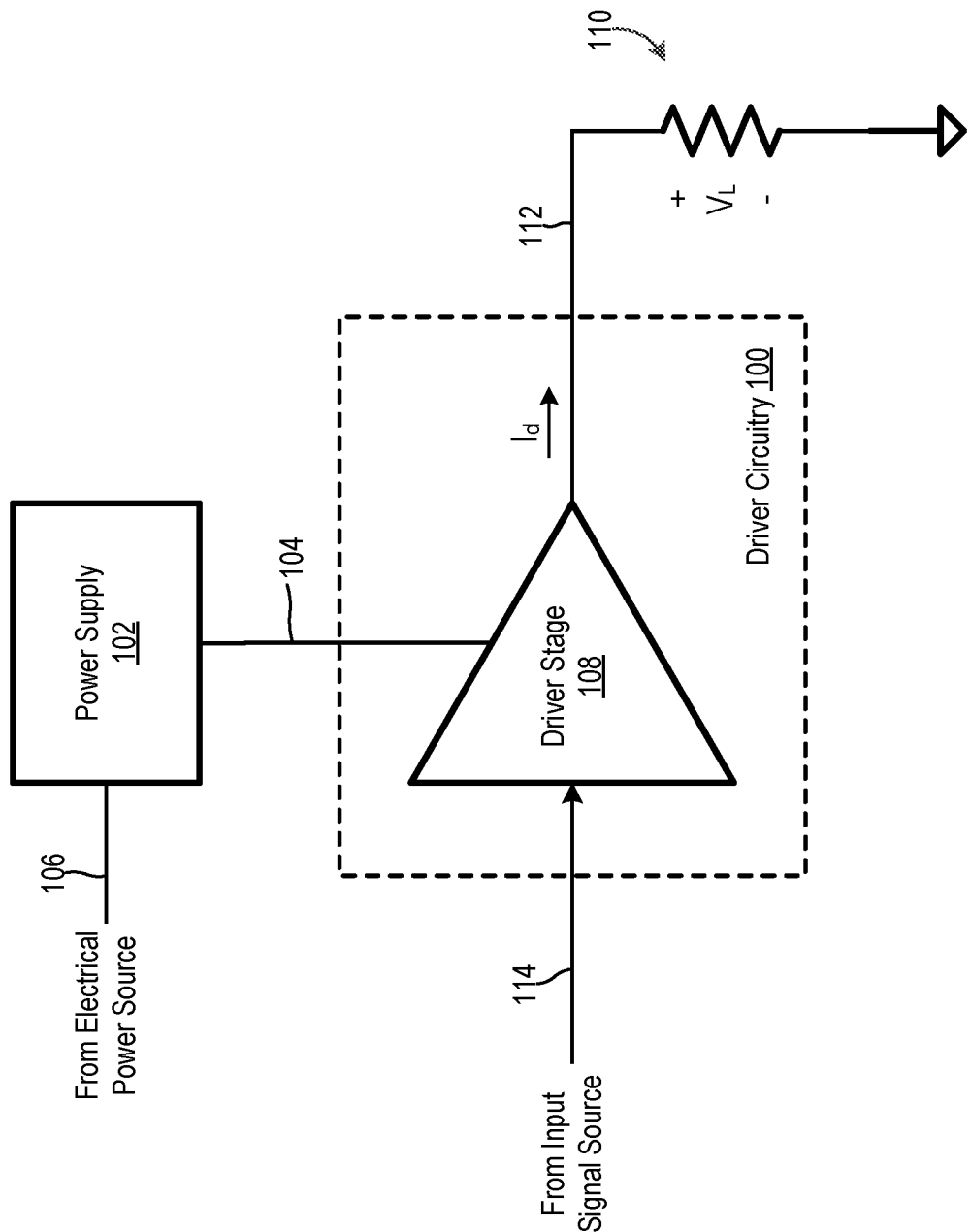
FIG. 1 is a schematic diagram illustrating driver circuitry powered from a fixed power supply voltage.

Some driver circuitry operates from a fixed power supply voltage. For example, FIG. 1 illustrates driver circuitry 100 which is powered from a power supply 102 which generates a fixed power supply voltage 104 from an input electrical power source 106. Driver circuitry 100 includes a driver stage 108 which generates an output signal 112 in response to an input signal 114 for driving a load 110. Power supply voltage 104 must have sufficiently high magnitude for driver stage 108 to achieve minimum required voltage headroom, where voltage headroom is a difference between driving voltage of driver stage 108 and voltage $V_L$ of load 110. For example, consider a scenario where (a) minimum required voltage headroom is 2.5 volts, (b) driver stage 108 has a maximum driving current $I_d$ magnitude of 25 milliamperes (mA), and (c) load 110 has an impedance of 500 ohms. In this case, load voltage $V_L$ is 12.5 volts (500 ohms*25 mA), and power supply voltage 104 must be 15 volts (12.5 volts+2.5 volts) to achieve a voltage headroom of 2.5 volts.

In applications where impedance magnitude of load 110 is known, a minimum magnitude of power supply voltage 104 can be determined to achieve minimum required voltage headroom. For example, in the scenario discussed above, the minimum magnitude of power supply voltage 104 is 15 volts to achieve a minimum required voltage headroom of 2.5 volts. However, in applications where impedance magnitude of load 110 is unknown, power supply voltage 104 magnitude must be sufficiently high to achieve minimum required voltage headroom at a maximum possible impedance magnitude of load 110. Setting power supply voltage 104 magnitude for the maximum impedance magnitude of load 110 may result in excessive power dissipation if load 110 has a lower impedance. For example, consider a scenario like that discussed above but where impedance magnitude of load 110 may range from 10 to 500 ohms, depending on the application of driver circuitry 100. Minimum magnitude of power supply voltage 104 must be chosen to achieve sufficient voltage headroom at maximum load impedance, and therefore, power supply voltage 104 must be at least 15 volts, as discussed above. If impedance magnitude of load 110 is low, however, significant power will be dissipated in driver stage 108. For example, if load 110 has an impedance of 10 ohms, 369 milliwatts (mW), (15 volts*25 mA-10 ohms*$[25 mA]^2$) will be dissipated in driver stage 108. Such relatively large power dissipation may be problematic, especially in applications where driver stage 108 is part of an integrated circuit having limited cooling capability.

Figure 2:
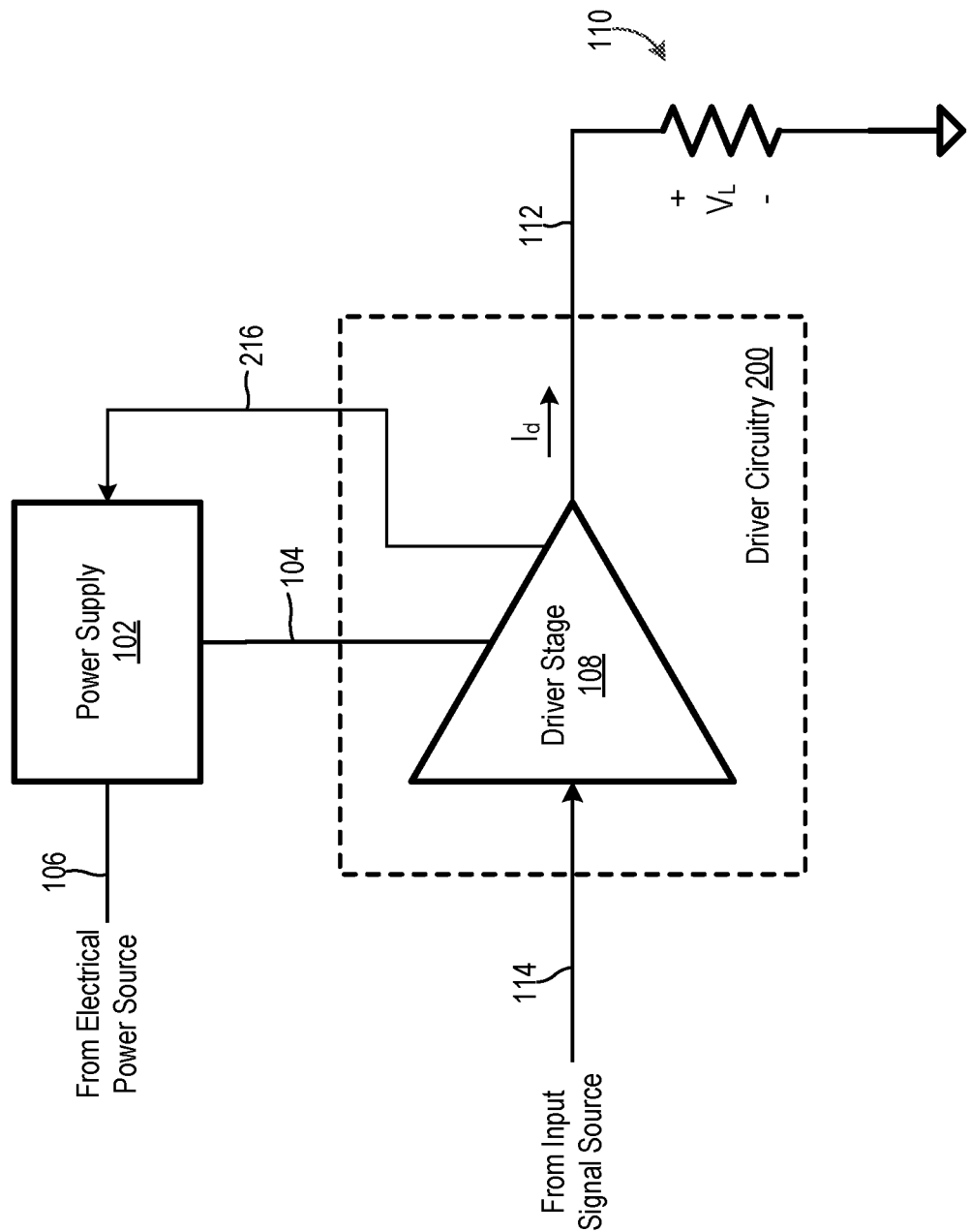
FIG. 2 is a schematic diagram illustrating driver circuitry having dynamic power tracking capability.

Dynamic power tracking can help prevent excessive power dissipation in driver stage 108. For example, FIG. 2 is a schematic diagram illustrating driver circuitry 200 having dynamic power tracking capability. Driver circuitry 200 is similar to driver circuitry 100 of FIG. 1, but driver circuitry 200 further includes a feedback path 216 enabling power supply 102 to monitor voltage headroom in driver stage 108. Power supply 102 varies magnitude of power supply voltage 104 as required to maintain a predetermined voltage headroom in driver stage 108. Accordingly, power supply 102 has a closed-loop control system. Such closed-loop control system helps prevent excessive power dissipation in driver stage 108 when load 110 has a low impedance magnitude. However, the closed-loop control system has several significant disadvantages. For example, the closed-loop control system may become unstable under certain conditions, e.g., when load 110 has an impedance value that is different from an assumed impedance value used in the design of driver circuitry 200. As another example, the closed-loop control system inherently has a limited bandwidth, which may prevent power supply 102 from responding to changes in operating conditions sufficiently quickly to prevent performance degradation.

Disclosed herein are driver circuitry and associated methods which at least partially overcome one or more of the problems discussed above. Certain embodiments of the new driver circuitry are configured to set power supply voltage in a manner which accounts for load impedance and without requiring a closed-loop control system. For example, in some embodiments, required driver stage power supply voltage is determined in a configuration mode of the driver circuitry, and a power supply is controlled to provide the required power supply voltage as a static power supply voltage in a driving mode of the driver circuitry. Accordingly, these embodiments advantageously help prevent excessive driver stage power dissipation without necessitating use of a closed-loop control system. The configuration mode of the driver circuitry is an operating mode where the required driver stage power supply voltage is determined. The driver circuitry operates in its configuration mode, for example, at driver circuitry start-up, driver circuitry set-up, and/or after predetermined amount of time has elapsed since driver circuitry start-up or driver circuitry set-up. The driving mode of the driver circuitry, which is different from the configuration mode of the driver circuitry, is an operating mode where the driver circuitry drives a load in response to an input signal.

Figure 3:
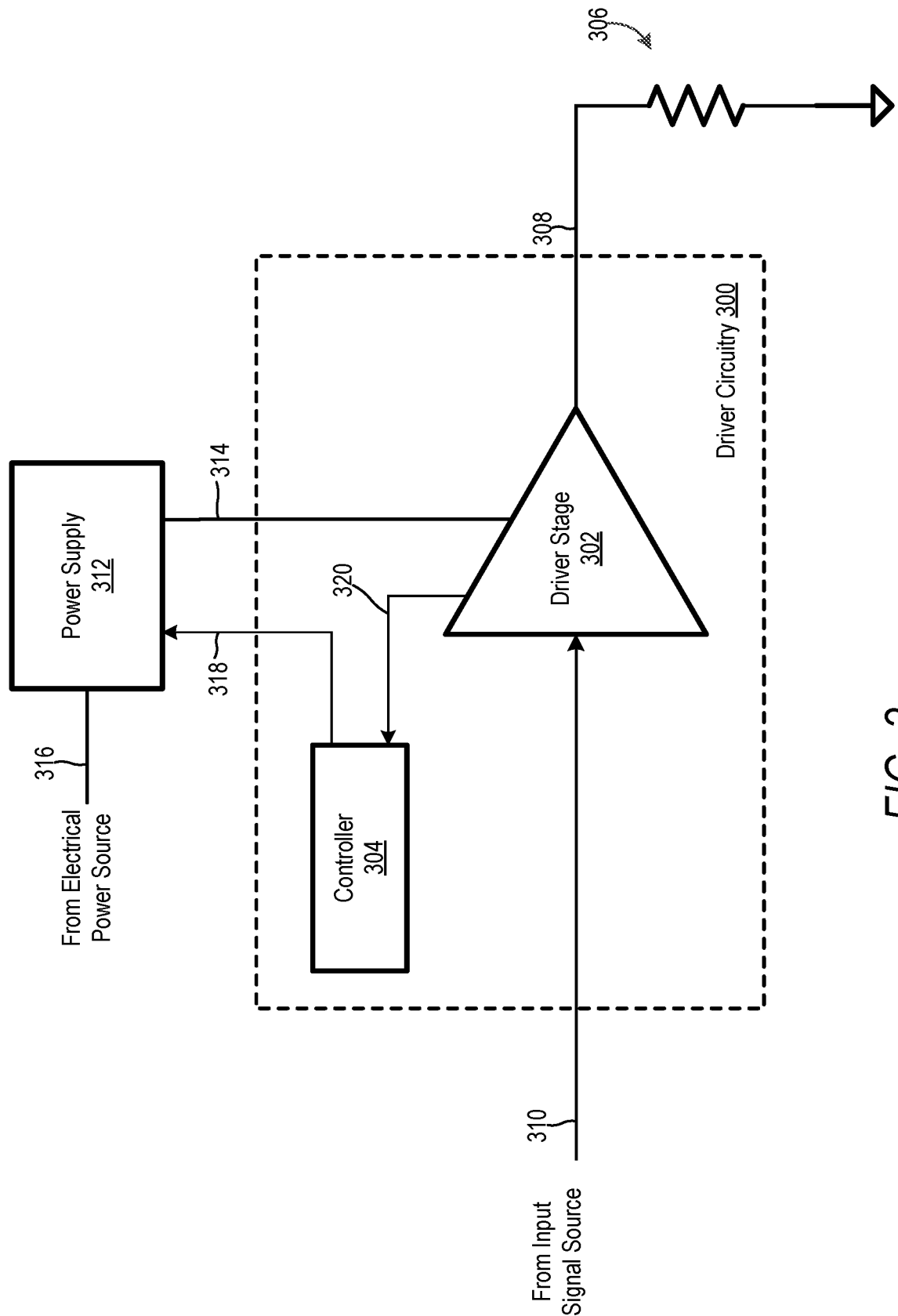
FIG. 3 is a schematic diagram illustrating driver circuitry configured to operate at one of a plurality of static power supply voltages, according to an embodiment.

FIG. 3 is a schematic diagram illustrating driver circuitry 300 which is configured to operate at one of a plurality of static power supply voltages. Driver circuitry 300 is one embodiment of the new driver circuitry developed by Applicant. Driver circuitry 300 includes a driver stage 302 and a controller 304. Driver stage 302 is configured to drive a load 306 with an output signal 308 in response to an input signal 310 from an input signal source, in a driving mode of driver circuitry 300. Input signal 310 is, for example, an analog signal or a digital signal. Load 306 is, for example, a resistive load, a capacitive load, and/or an inductive load. For example, in some embodiments, load 306 includes one or more of an electric motor, a speaker, a pump, a relay, a switch, an actuator, a transistor, a magnetic device, a light, an electric heater, and an electric device under test. In some embodiments, output signal 308 is a voltage signal, and in some other embodiments, output signal 308 is a current signal. One possible configuration of driver stage 302 is discussed below with respect to FIG. 10, but it should be appreciated that driver stage 302 is not limited to the configuration of FIG. 10.

A power supply 312 generates a power supply voltage 314 from an input electrical power source 316. Driver stage 302 is at least partially electrically powered from power supply voltage 314. Controller 304 is configured to (a) determine, e.g. in a configuration mode of driver circuitry 300, a required magnitude of power supply voltage 314 for driver stage 302 to drive load 306, and (b) control power supply 312 via a power supply select signal 318 to provide the required power supply voltage to driver stage 302 as a static power supply voltage, e.g. in a driving mode of driver circuitry 300. In particular embodiments, controller 304 determines required magnitude of power supply voltage 314 at start-up of driver circuitry 300 or during set-up of driver circuitry 300. Accordingly, controller 304 controls power supply 312 independent of voltage $V_L$ across load 306 during normal operation of driver circuitry 300, e.g., while driver stage drives load 306 in response to input signal 310 in the driving mode of driver circuitry 300.

The required magnitude of power supply voltage 314 is, for example, a minimum of two or more available power supply voltages 314 which achieves required voltage headroom in driver stage 302. For example, in some embodiments, power supply 312 is configured to provide a plurality of discrete power supply voltages 314, and controller 304 controls power supply 312 to provide a smallest one of the discrete static power supply voltages 314 which achieves required voltage headroom in driver stage 302 as a static voltage. In some other embodiments, power supply 312 is configured to provide a continuously variable power supply voltage 314, and controller 304 controls power supply 312 to provide a smallest static power supply voltage 314 which achieves required voltage headroom in driver stage 302. Voltage headroom is a difference between driving voltage of driver stage 302 and voltage $V_L$ across load 306, and one example of voltage headroom is discussed below with respect to FIG. 10. In some embodiments, driver stage 302 generates a voltage headroom signal 320 which controller 304 uses to determine whether driver stage 302 has sufficient voltage headroom. In some embodiments, voltage headroom signal 320 is a digital signal indicating whether driver stage 302 has sufficient voltage headroom, and in some other embodiments, voltage headroom signal 320 is an analog or digital signal representing magnitude of voltage headroom in driver stage 302.

Figure 4:
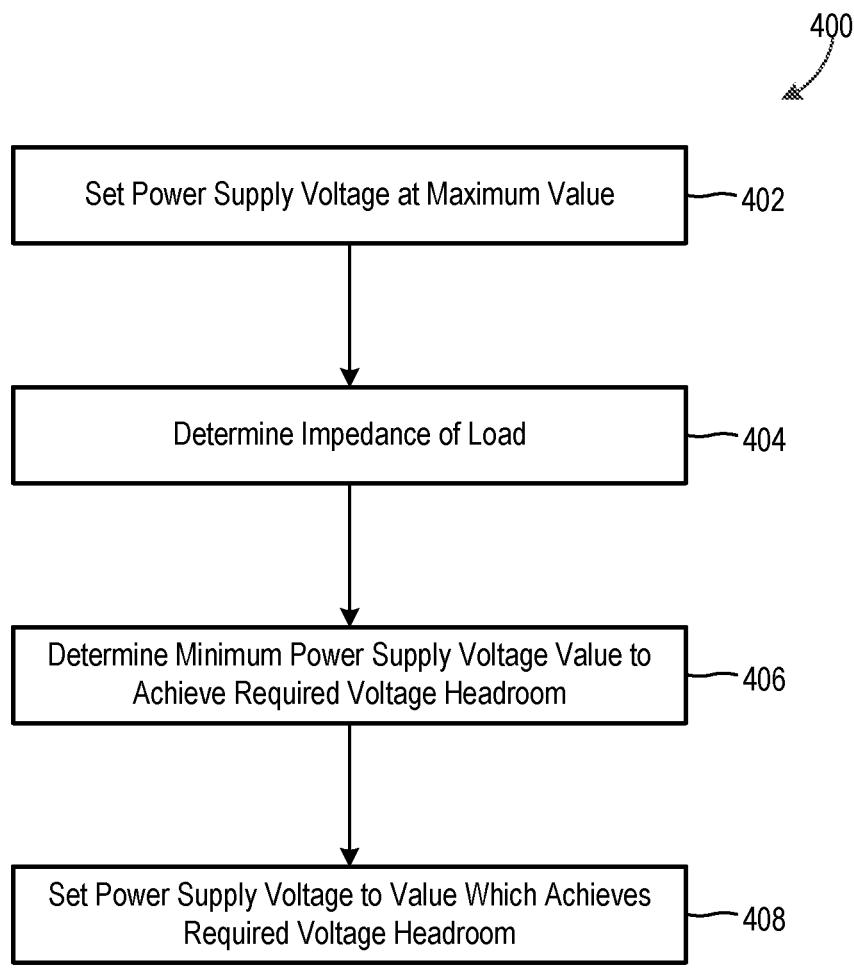
FIG. 4 is a flow chart illustrating a method for setting a static power supply voltage of the FIG. 3 driver circuitry, according to an embodiment

FIG. 4 is a flow chart illustrating one possible method 400 for setting static power supply voltage 314 of driver circuitry 300 to achieve sufficient voltage headroom in driver stage 302. Controller 304 performs method 400, for example, in a configuration mode of driver circuitry 300, such as at start-up of driver circuitry 300 or during set-up of driver circuitry 300, to provide the required magnitude of power supply voltage 314 to driver stage 302 as a static power supply voltage. It should be realized, however, that driver stage 300 is not limited to operation by method 400, and driver stage 300 could instead be operated in other manners without departing from the scope hereof. For example, FIG. 5, discussed below, illustrates another possible method for setting static power supply voltage 314 of driver circuitry 300.

Referring to FIG. 4, in block 402, controller 304 generates power supply select signal 318 to set power supply voltage 314 to a maximum value, e.g., to a maximum possible output voltage of power supply 312. In block 404, controller 304 determines impedance of load 306. In one example of block 404, (a) controller 304 drives load 306 with an output signal 308, (b) controller 304 determines voltage and current magnitude of output signal 308, one of which may be predetermined, (c) and controller 304 determines impedance of load 306 from the voltage and current magnitude of output signal 308. For example, in a particular embodiment, controller 304 determines impedance (Z) of load 306 using the following equation, or a variation thereof, where I is current magnitude of output signal 308 and V is voltage magnitude of output signal 308:

$$Z = V/I \qquad \text{(EQN. 1)}$$

In block 406, controller 304 determines a minimum value of power supply voltage 314 ($V_{ps\_min}$) to achieve required voltage headroom in driver stage 302. For example, in a particular embodiment, controller 304 determines $V_{ps\_min}$ using the following formula, where $I_d$ is maximum driving current magnitude of driver stage 302, Z is impedance of load 306 as determined in block 404, and $V_h$ is minimum required voltage headroom in driver stage 302:

$$V_{ps\_min} = V_h + I_d * Z \qquad \text{(EQN. 2)}$$

In block 408, controller 304 generates power supply select signal 318 to set power supply voltage 314 to a minimum possible static value which achieves $V_{ps\_min}$ determined in block 406. For example, in one embodiment, power supply 312 is configured to provide three discrete power supply voltages 314, and controller 304 generates power supply select signal 318 to select a minimum one of the three discrete power supply voltages 314 which achieves $V_{ps\_min}$ determined in block 406. For instance, in one example scenario, power supply 312 is configured to provide power supply voltage 314 at any one of 5, 10, and 15 volts, and controller 304 determines in block 406 that $V_{ps\_min}$ is 8 volts. In this example scenario, controller 304 would generate power supply select signal 318 such that power supply 312 provides a static power supply voltage 314 of 10 volts, which is the minimum of the three possible power supply voltages 314 which achieves a $V_{ps\_min}$ of 8 volts. As another example, in another embodiment, power supply 312 is configured to provide a continuously variable power supply voltage 314, and controller 304 controls power supply 312 via power supply select signal 318 such that power supply voltage 314 is equal to, or is at least substantially equal to, a static voltage of $V_{ps\_min}$.

Figure 5:
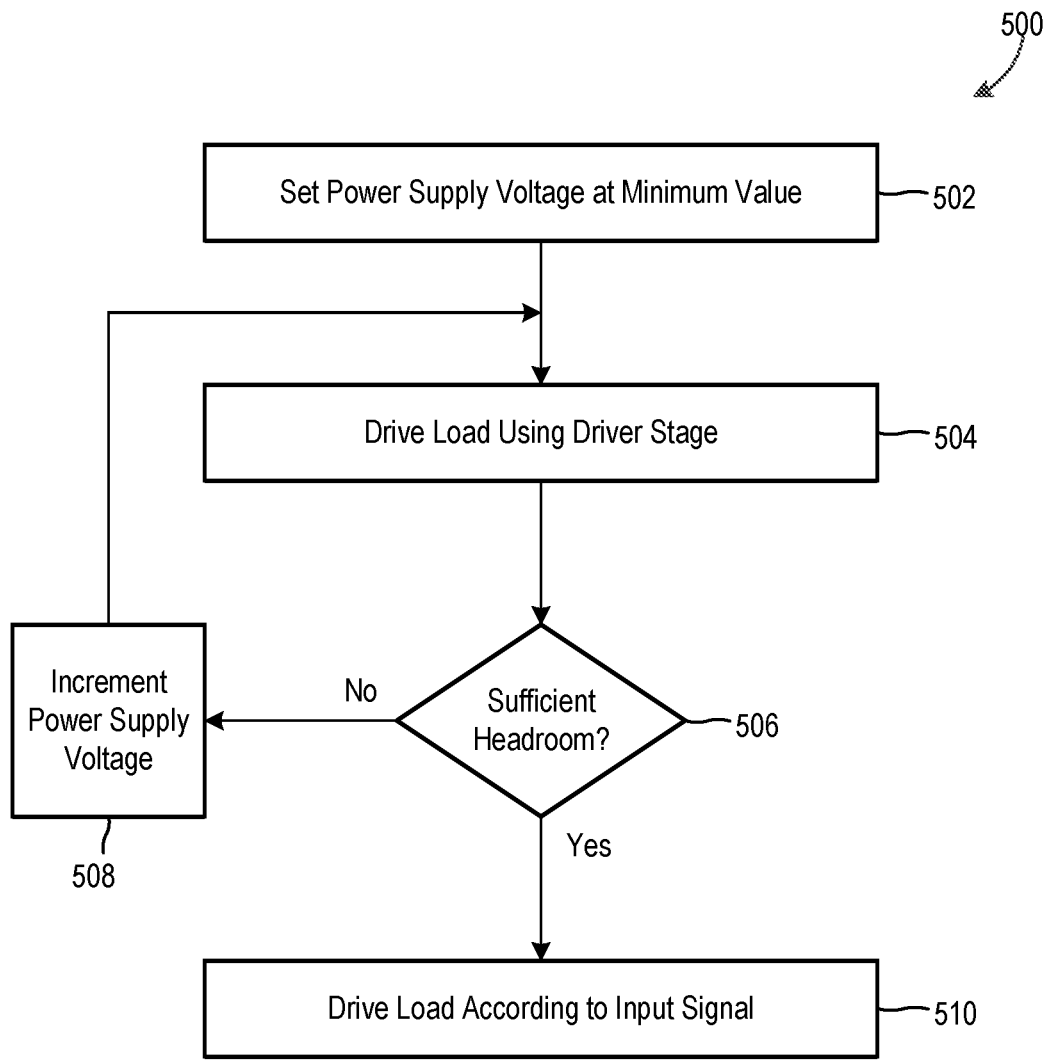
FIG. 5 is a flow chart illustrating another method for setting a static power supply voltage of the FIG. 3 driver circuitry, according to an embodiment.

FIG. 5 is a flow chart illustrating another possible method 500 for setting static power supply voltage 314 of driver circuitry 300 to achieve sufficient voltage headroom in driver stage 302. Controller 304 performs method 500, for example, in a configuration mode of driver circuitry 300, such as at start-up of driver circuitry 300 or set-up of driver circuitry 300, to provide the required magnitude of power supply voltage 314 to driver stage 302 as a static power supply voltage.

In block 502, controller 304 generates power supply select signal 318 to set power supply voltage 314 to a minimum value, e.g., to a minimum available output voltage of power supply 312. In block 504, driver stage 302 drives load 306, e.g., by applying a voltage or current output signal 308 to load 306, to generate voltage $V_L$ across load 306. In block 506, controller 304 determines whether driver stage 302 has sufficient voltage headroom. In one example of block 506, controller 304 determines whether driver stage 302 has sufficient voltage headroom using voltage headroom signal 320. If driver stage 302 does not have sufficient voltage headroom, controller 304 generates power supply select signal 318 in block 508 to increment magnitude of power supply voltage 314, e.g., by increasing magnitude of power supply voltage 314 to a next highest value of a plurality of available discrete output voltages of power supply voltage 314. Method 500 returns to block 504 from block 508. On the other hand, if driver stage 302 has sufficient headroom voltage, power supply voltage 314 is unchanged, and method 500 proceeds from block 506 to block 510 where driver stage 302 drives load 306 according to input signal 310.

Figure 6:
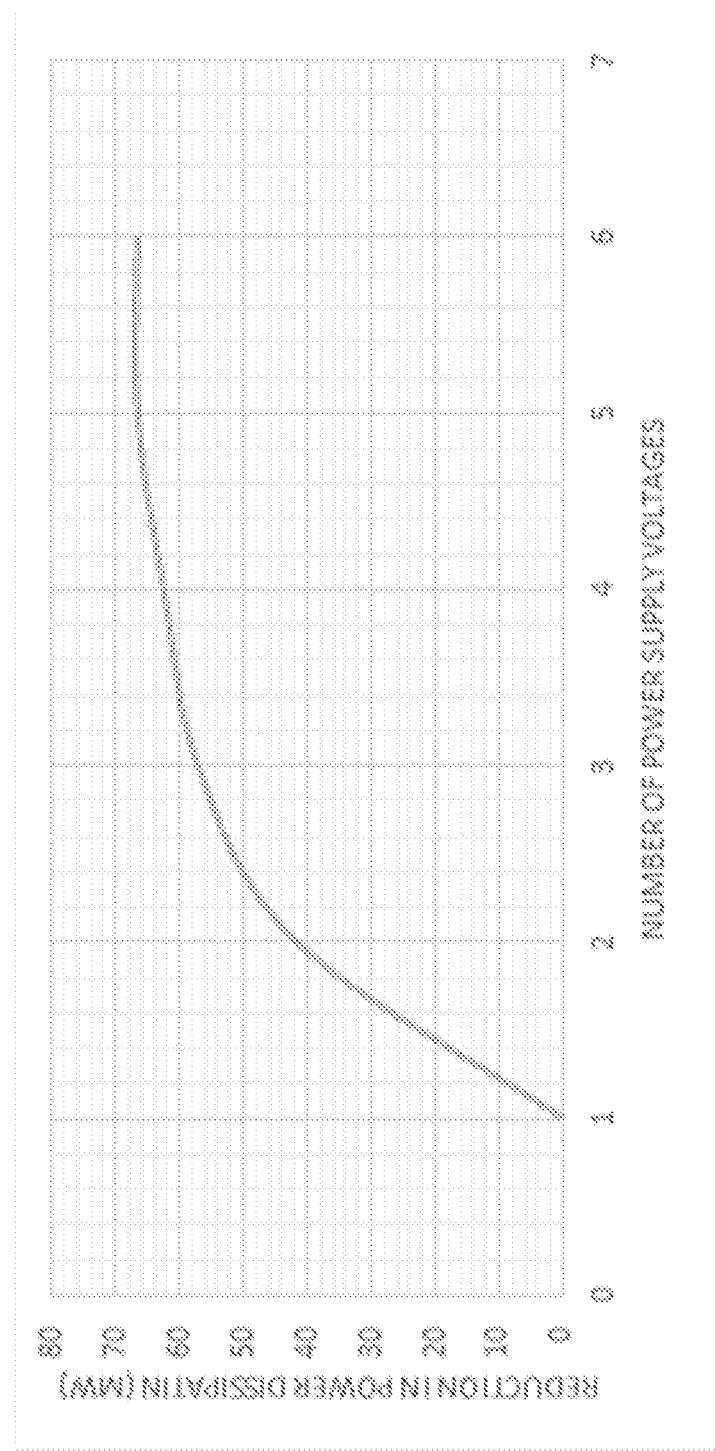
FIG. 6 is a graph illustrating reduction in driver stage power dissipation as a function of number of available power supply voltages.

The ability of controller 304 to set power supply voltage 314 to one of several available values helps optimize driver circuitry 300 for impedance magnitude of load 306, and the ability to optimize driver circuitry 300 increases with number of available power supply voltages 314. However, increasing the number of available power supply voltages 314 may undesirably increase cost and/or complexity of power supply 312. Applicant has determined that configuring power supply 312 to be capable of providing three different power supply voltages 314 may provide an optimum balance between high performance of driver circuitry 300 and low cost and complexity of power supply 312. For example, FIG. 6 is a graph 600 illustrating reduction in driver stage power dissipation as a function of number of available power supply voltages. Applicant obtained the data of graph 600 via simulations. As can be determined from graph 600, increasing the number of available power supply voltages from one to two can achieve over a 40 mW reduction in driver stage power dissipation, and increasing the number of available power supply voltages from one to three can achieve over a 55 mW reduction in driver stage power dissipation. Increasing the number of available power supply voltages beyond three, however, achieves a relatively modest further reduction in power dissipation. Therefore, three available power supply voltages may represent an optimum balance between minimal power dissipation and minimal power supply cost/complexity. Accordingly, in some embodiments, power supply 312 is capable of providing three different power supply voltage 314 magnitudes.

In some applications of driver circuitry 300, voltage magnitude of input electrical power source 316 may vary. Such variation in input electrical power source 316 voltage may cause variation in magnitude of power supply voltage 314 in embodiments where power supply 312 does not regulate its output voltage. Variation in magnitude of power supply voltage 314 may be problematic, such as where power supply voltage 314 magnitude variation causes insufficient voltage headroom in driver stage 302. Therefore, some embodiments of driver circuitry 300 have feedforward control capability where operation of power supply 312 is adjusted in response to a change in voltage of input electrical power source 316.

Figure 7:
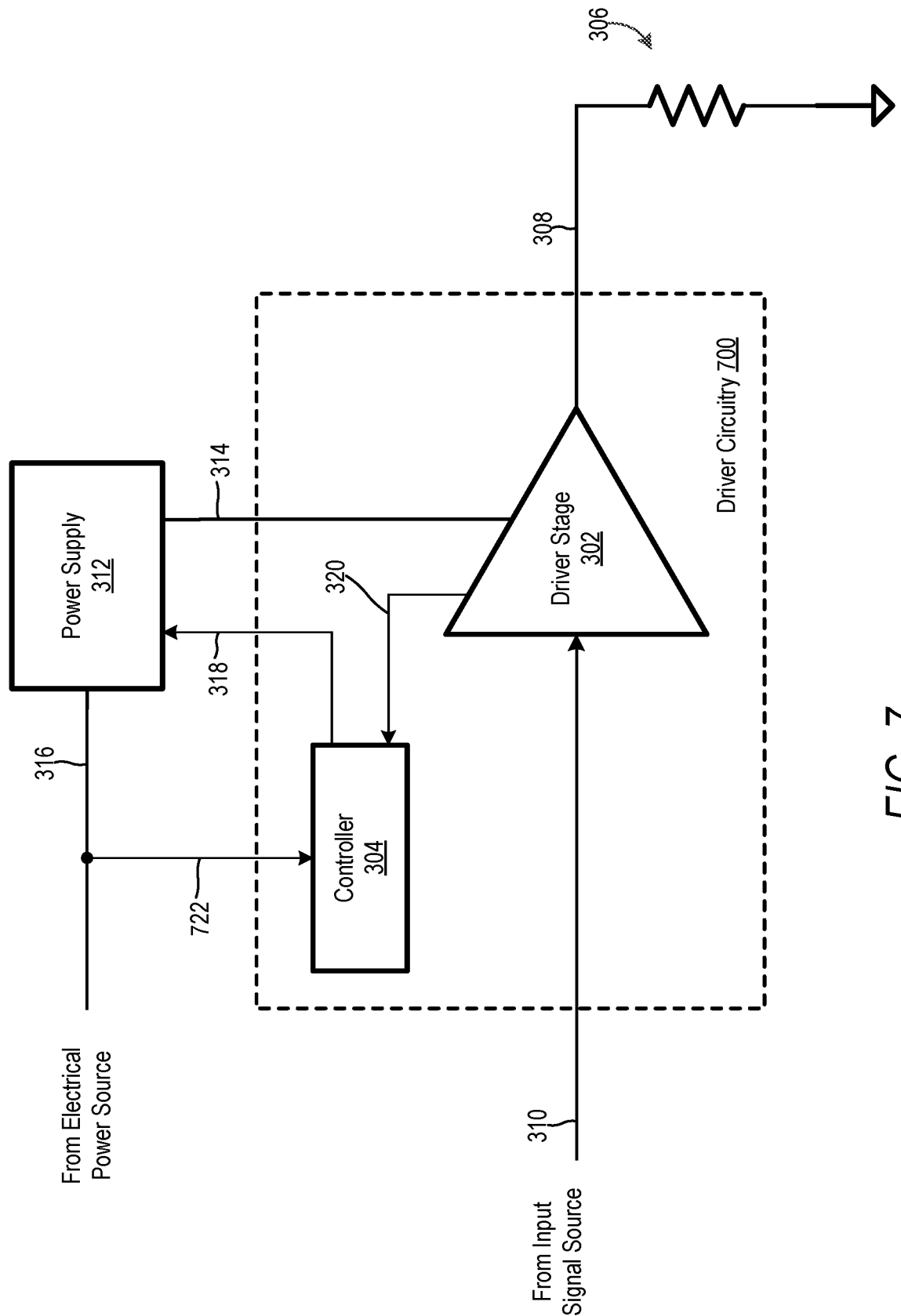
FIG. 7 is a schematic diagram illustrating driver circuitry configured to operate at one of a plurality of static power supply voltages and having feedforward control capability, according to an embodiment.

For example, FIG. 7 is a schematic diagram illustrating driver circuitry 700 having feedforward control capability. Driver circuitry 700 is similar to driver circuitry 300, but controller 304 in driver circuitry 700 is further configured to adjust operation of power supply 312 in response to a change in voltage 722 of input electrical power source 316. For example, in some embodiments of driver circuitry 700, controller 304 is configured to linearly increase a transfer function of power supply 312 as magnitude of voltage 722 decreases, and controller 304 is configured to linearly decrease the transfer function of power supply 312 as magnitude of voltage 722 increases. The transfer function of power supply 312 is a ratio of power supply voltage 314 magnitude to voltage 722 magnitude. For example, if power supply 312 has a transfer function of 0.25, magnitude of power supply voltage 314 will be one quarter of magnitude of voltage 722. In some other embodiments of driver circuitry 700, controller 304 is configured to adjust the transfer function of power supply 312 in a step-wise manner in response to voltage 722 magnitude crossing a threshold value. For example, in a particular embodiment, controller 304 is configured to increase the transfer function of power supply 312 in a step-wise manner in response to voltage 722 magnitude falling below a threshold value, and controller 304 is configured to decrease the transfer function of power supply 312 in a step-wise manner in response to voltage 722 magnitude rising above a threshold value.

Figure 8:
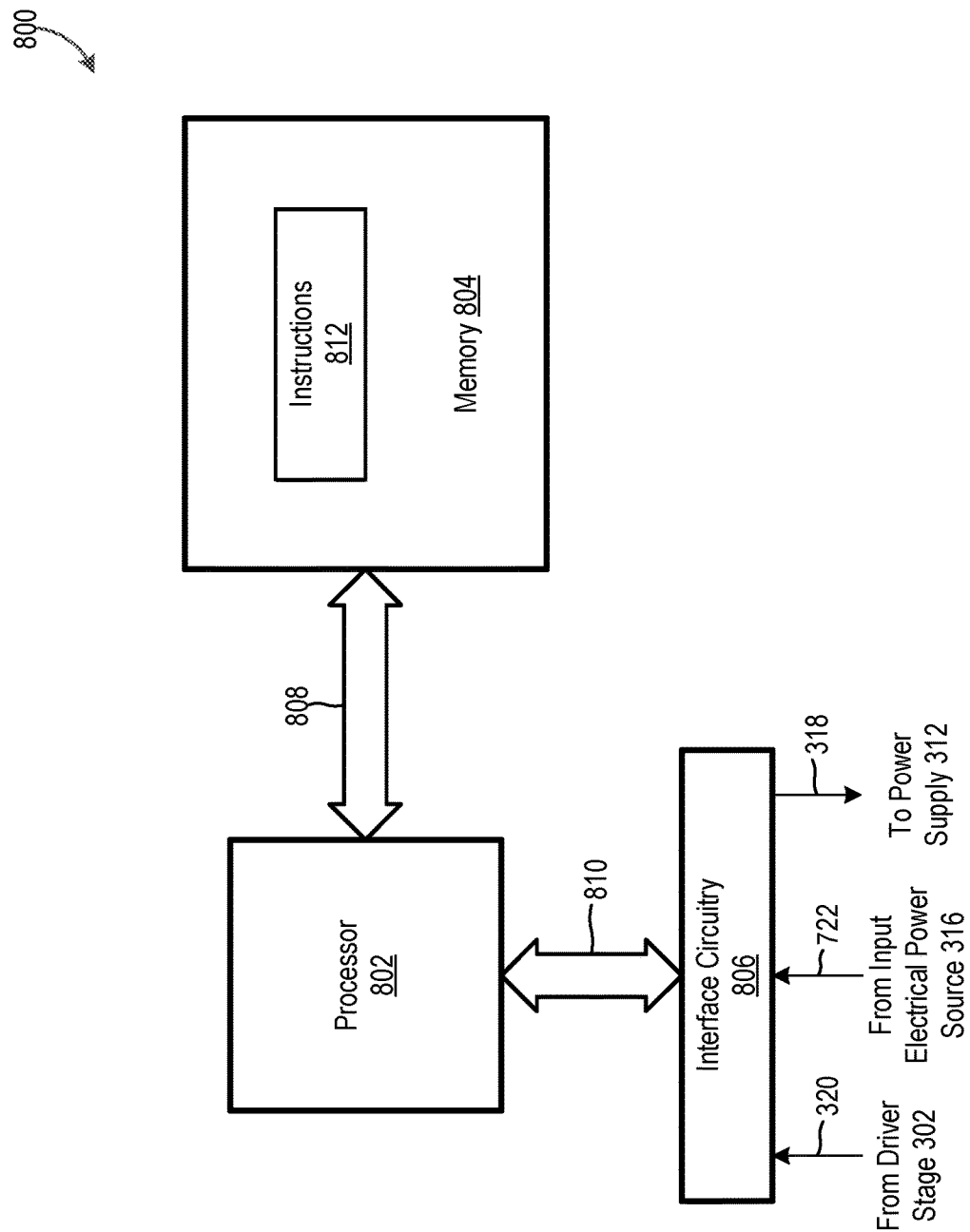
FIG. 8 is a schematic diagram illustrating a controller, according to an embodiment.

In particular embodiments, controller 304 includes digital and/or analog circuitry. For example, FIG. 8 is a schematic diagram illustrating a controller 800, which is one possible embodiment of controller 304. Controller 800 includes a processor 802, memory 804, and interface circuitry 806. Processor 802 is communicatively coupled to memory 804 via a data bus 808, and processor 802 is communicatively coupled to interface circuitry 806 via a data bus 810. Processor 802 executes instructions 812 in the form of software and/or firmware stored in memory 804 to perform the functions of controller 304. For example, in some embodiments, processor 802 executes instructions 812 to execute method 400 of FIG. 4 or method 500 of FIG. 5, and in some embodiments, processor 802 executes instructions 812 to adjust the transfer function of power supply 312 in a manner discussed above with respect to FIG. 7. Interface circuitry 806 interfaces processor 802 with external circuitry, e.g., to receive voltage headroom signal 320 and voltage 722, and to transmit power supply select signal 318. For example, in some embodiments, interface signal 806 changes the form and/or magnitude of signals for compatibility of processor 802 with external circuitry.

Although controller 304 is illustrated as a single element, controller 304 could be implemented via multiple elements. Additionally, controller 304 is not required to be dedicated to driver circuitry 300. To the contrary, in some embodiments, controller 304 is part of a larger system which performs functions in addition to controlling aspects of driver circuitry 300.

Figure 9:
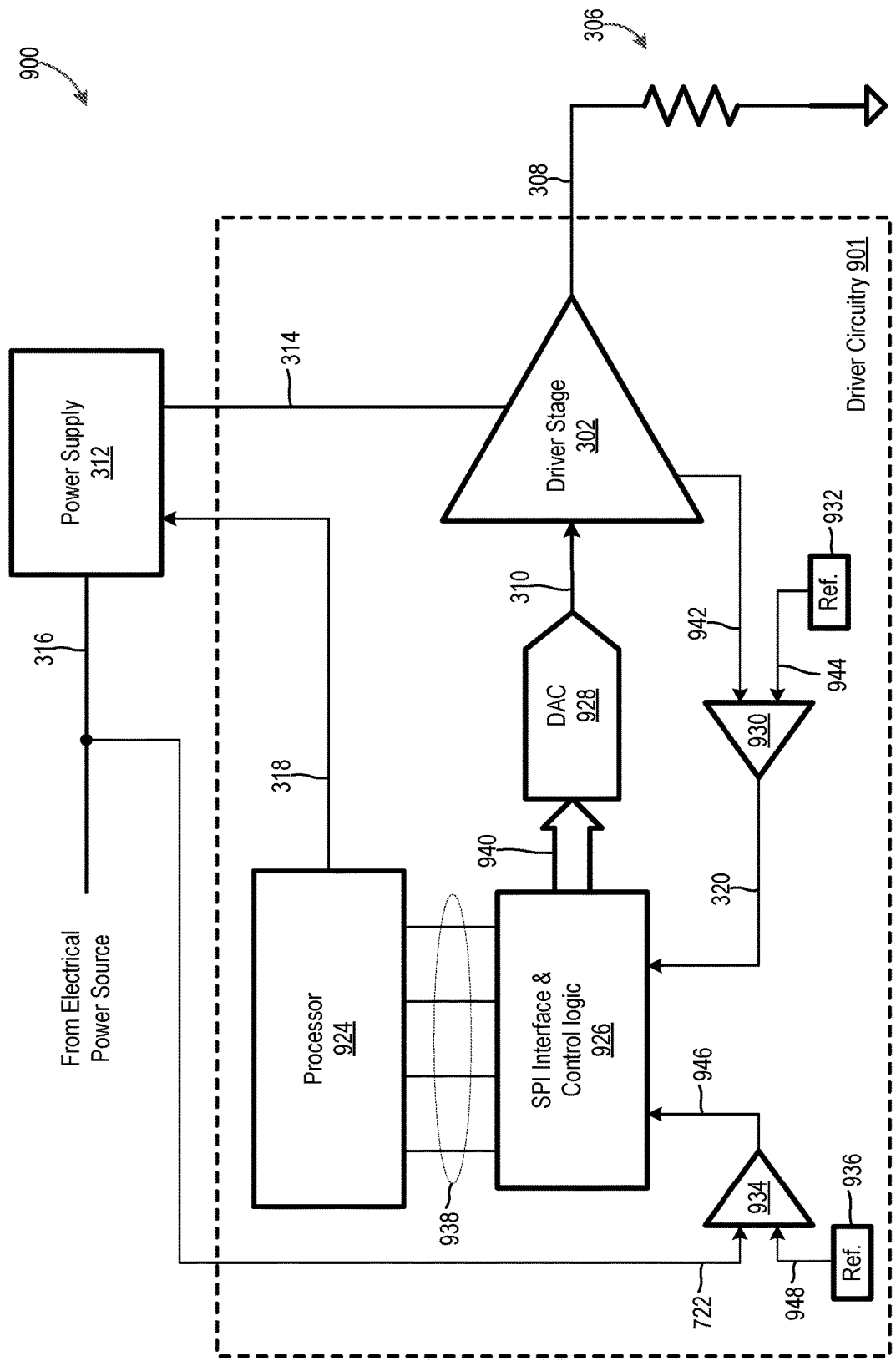
FIG. 9 is a schematic diagram illustrating a programmable logic controller including an embodiment of the FIG. 7 driver circuitry, according to an embodiment.

For example, FIG. 9 is a schematic diagram illustrating a programmable logic controller (PLC) 900 including driver circuitry 901, where driver circuitry 901 is an embodiment of driver circuitry 700 of FIG. 7. Driver circuitry 901 includes driver stage 302, a processor 924, serial peripheral interface (SPI) and control logic 926, a DAC 928, a first comparator 930, a first reference 932, a second comparator 934, and a second reference 936. Processor 924, SPI/control logic 926, DAC 928, first comparator 930, first reference 932, second comparator 934, and second reference 936 collectively form an embodiment of controller 304. However, processor 924 may also perform functions that are not directly related to driving load 306. For example, processor 924 may execute one or more algorithms to generate data that will determine input signal 310.

Processor 924 serially communicates with SPI/control logic 926 via SPI signals 938 which include, for example, a serial clock signal, a slave-select signal, a serial input signal, and a serial output signal. SPI/control logic 926 transforms serial-form data generated by processor 924 to parallel-form data 940, and DAC 928 converts data 940 to input signal 310. First comparator 930 and first reference 932 collectively generate voltage headroom signal 320. In particular, comparator 930 compares a first voltage signal 942 to a first reference signal 944, where first voltage signal 942 represents voltage headroom in driver stage 302 and first reference signal 944 represents required voltage headroom of driver stage 302. First reference signal 944 is generated by first reference 932. First comparator 930 asserts voltage headroom signal 320 in response to first voltage signal 942 rising above first reference signal 944, which indicates that driver stage 302 has sufficient voltage headroom. Processor 924 generates power supply select signal 318 to control power supply 312 to provide required power supply voltage to driver stage 302 as a static power supply voltage, such as in a manner similar to that discussed above with respect to FIG. 4 or FIG. 5.

Second comparator 934 and second reference 936 collectively generate a feedforward signal 946 which is communicatively coupled to processor 924 via SPI/control logic 926 and SPI signals 938. In particular, second reference 936 generates a second reference signal 948, and second comparator 934 compares voltage 722 to second reference signal 948. Second comparator 934 asserts feedforward signal 946 in response to voltage 722 crossing second reference signal 948. Processor 924 generates power supply select signal 318 to cause power supply 312 to change its transfer function in response to assertion of feedforward signal 946, such as in a manner similar to that discussed above with respect to FIG. 7.

Figure 10:
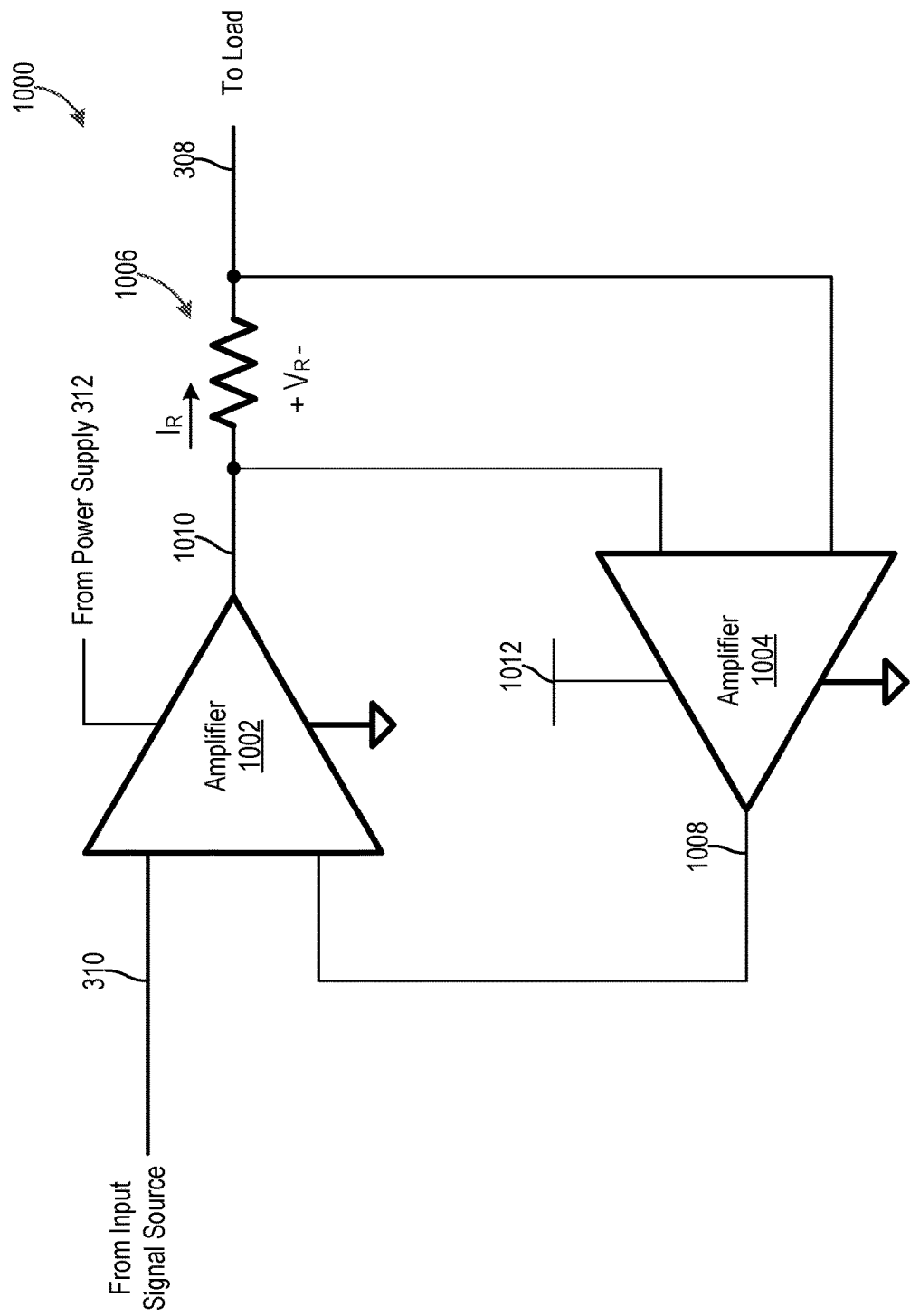
FIG. 10 is a schematic diagram illustrating a driver stage, according to an embodiment.

FIG. 10 is a schematic diagram illustrating a driver stage 1000, where driver stage 1000 is one possible embodiment of driver stage 302. Driver stage 1000 includes a first amplifier 1002, a second amplifier 1004, and a resistor 1006. First amplifier 1002 is powered from power supply 312, and first amplifier 1002 amplifies a difference between input signal 310 and an internal signal 1008 to generate an amplifier output signal 1010. Second amplifier 1004 is powered from a power rail 1012, and in some embodiments, power rail 1012 is the same as power supply voltage 314.

Driver stage 1000 may operate in either a current mode or in a voltage mode. In the current mode, output signal 308 is a current signal, and amplifier 1004 generates internal signal 1008 proportional to a voltage $V_R$ across resistor 1006, where voltage $V_R$ is proportional to current $I_R$ flowing through resistor 1006. Consequently, internal signal 1008 represents magnitude of current $I_R$, in the current mode. Amplifier 1002 amplifies a difference between input signal 310 and internal signal 1008 to generate output signal 308 as a current signal.

In the voltage mode, output signal 308 is a voltage signal, and second amplifier 1004 generates internal signal 1008 such that internal signal 1008 is proportional to amplifier output signal 1010. Consequently, first amplifier 1002 acts a buffer in the voltage mode, such that output signal 308 is a voltage signal representing input signal 310.

As discussed above, voltage headroom is the difference between driving voltage of driver stage 302 and voltage $V_L$ across load 306. In driver stage 1000, driving voltage is voltage of amplifier output signal 1010, and voltage $V_L$ across load 306 is equal to voltage of output signal 308. Consequently, voltage headroom is equal to voltage $V_R$ across resistor 1006, in driver stage 1000.

Figure 11:
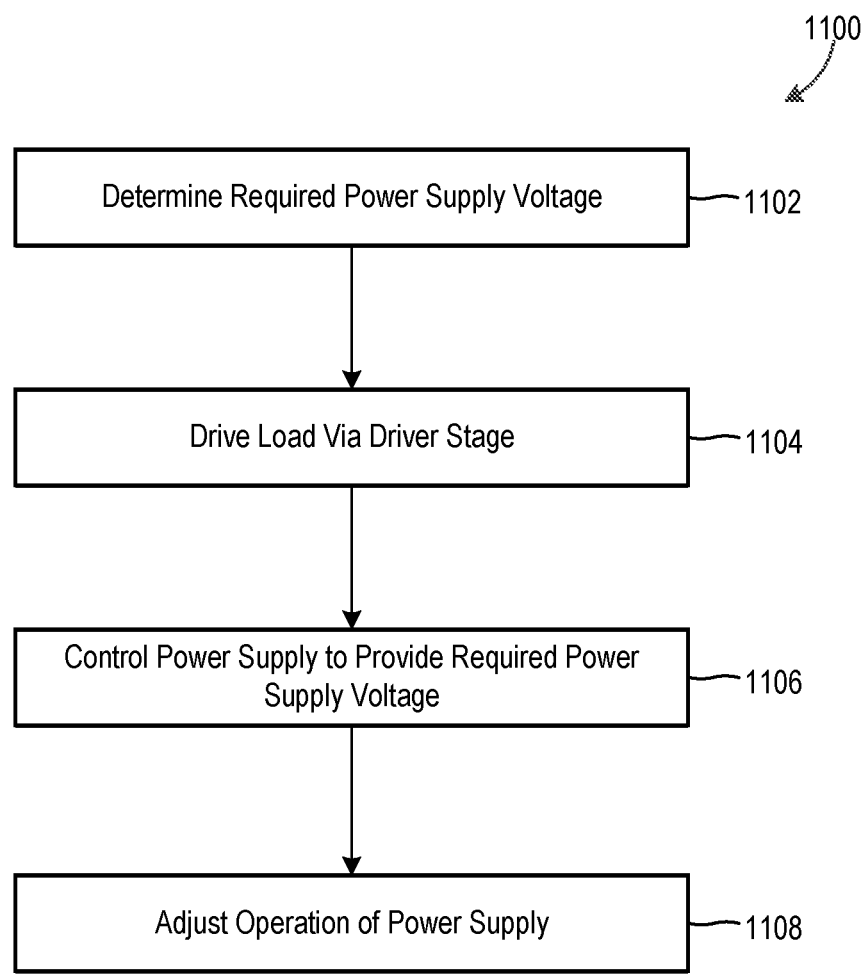
FIG. 11 is a flow chart illustrating a method for using driver circuitry to drive a load having an unknown impedance magnitude, according to an embodiment.

FIG. 11 is a flow chart illustrating a method 1100 for driving a load having an unknown impedance magnitude. In block 1102, a required power supply voltage is determined, where the required power supply voltage is voltage that is required for a driver stage to drive the load. In one example of block 1102, controller 304 determines a required power supply voltage 314 for driver stage 302 to drive load 306 with sufficient voltage headroom (FIG. 3 or 7), such as by using method 400 (FIG. 4) or method 500 (FIG. 5), in a configuration mode of driver circuitry 300. In block 1104, the load is driven via the driver stage in response to an input signal. In one example of block 1104, driver stage 302 drives load 306 with output signal 308 in response to input signal 310, in a driving mode of driver circuitry 300. In block 1106, a power supply is controlled to provide the required power supply voltage to the driver stage, as a static voltage. In one example of block 1104, controller 304 generates power supply select signal 318 to cause power supply 312 to provide the required power supply voltage determined in block 1102 as static voltage, in a driving mode of driver circuitry 300 while driver stage 302 drives load 306 with output signal 308 in response to input signal 310. In block 1108, operation of the power supply is changed in response to a change in a voltage of an input electrical power source to the power supply. In one example of block 1108, controller 304 generates power supply select signal 318 to increase the transfer function of power supply 312 in response to a decrease in magnitude of voltage 722 (FIG. 7). Block 1108 may be omitted from method 1100 without departing from the scope hereof.

Combinations of Features

Features described above may be combined in various ways without departing from the scope hereof. The following examples illustrate some possible combinations:

(A1) A method for using driver circuitry to drive a load having an unknown impedance magnitude may include (1)

in a configuration mode of the driver circuitry, determining a required power supply voltage for a driver stage to drive the load, and (2) in a driving mode of the driver circuitry, (a) driving the load via the driver stage in response to an input signal, and (b) controlling a power supply to provide the required power supply voltage to the driver stage as a static voltage, while driving the load via the driver stage in response to the input signal.

(A2) The method denoted as (A1) may further include determining the required power supply voltage for the driver stage based at least in part on a minimum power supply voltage required to achieve a desired voltage headroom in the driver stage.

(A3) The method denoted as (A1) may further include (1) determining an impedance of the load, (2) determining a minimum power supply voltage required to achieve a desired voltage headroom in the driver stage, based at least in part on the impedance of the load, and (3) determining the required power supply voltage for the driver stage based at least in part on the minimum power supply voltage required to achieve the desired voltage headroom in the driver stage.

(A4) In any one of the methods denoted as (A1) through (A3), controlling the power supply to provide the required power supply voltage as a static voltage may include controlling the power supply independently of magnitude of voltage across the load.

(A5) In any one of the methods denoted as (A1) through (A4), controlling the power supply to provide the required power supply voltage as a static voltage may include selecting between a plurality of voltages of the power supply.

(A6) In the method denoted as (A5), the plurality of voltages of the power supply may include a plurality of discrete voltages of the power supply.

(A7) In the method denoted as (A6), the plurality of discrete voltages of the power supply may consist of three voltages of the power supply.

(A8) In any of the methods denoted as (A1) through (A7), the load may be a resistive load.

(A9) Any one of the methods denoted as (A1) through (A8) may further include generating the input signal using a digital-analog-converter (DAC).

(A10) Any one of the methods denoted as (A1) through (A9) may further include driving the load with a voltage signal, using the driver stage.

(A11) Any one of the methods denoted as (A1) through (A9) may further include driving the load with a current signal, using the driver stage.

(B1) Driver circuitry may include (a) a first driver stage configured to drive a load in response to an input signal and (b) a controller configured to (1) determine a required power supply voltage for the first driver stage to drive the load, in a configuration mode of the driver circuitry, and (2) control a power supply to provide the required power supply voltage to the first driver stage as a static voltage, while the first driver stage drives the load in response to the input signal, in a driving mode of the driver circuitry.

(B2) In driver circuitry denoted as (B1), the controller may be further configured to determine the required power supply voltage for the first driver stage based at least in part on a minimum power supply voltage required to achieve a desired voltage headroom in the first driver stage.

(B3) In the driver circuitry denoted as (B1), the controller may be further configured to (a) determine an impedance of the load, (b) determine a minimum power supply voltage required to achieve a desired voltage headroom in the driver stage, based at least in part on the impedance of the load, and (c) determine the required power supply voltage for the driver stage based at least in part on the minimum power supply voltage required to achieve the desired voltage headroom in the driver stage.

(B4) In any one of the driver circuitry denoted as (B1) through (B3), the controller may be further configured to control the power supply independently of magnitude of voltage across the load.

(B5) In any one of the driver circuitry denoted as (B1) through (B4), the controller may be further configured to control the power supply to provide the required power supply voltage to the first driver stage as a static voltage by selecting between a plurality of voltages of the power supply.

(B6) In the driver circuitry denoted as (B5), the plurality of voltages of the power supply may include a plurality of discrete voltages of the power supply.

(B7) In the driver circuitry denoted as (B6), the plurality of discrete voltages of the power supply may consist of three voltages of the power supply.

(B8) Any one of the driver circuitry denoted as (B1) through (B7) may further include a digital-analog-converter (DAC) configured to generate the input signal.

(B9) Any one the driver circuitry denoted as (B1) through (B8) may be incorporated within a programmable logic controller (PLC).

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A method for using driver circuitry to drive a load having an unknown impedance magnitude, comprising:
    in a configuration mode of the driver circuitry, producing, via the driver stage, a headroom signal representing the voltage headroom available and using the headroom signal to control the power supply to achieve at least a predetermined desired voltage headroom in the driver stage; and
    in a driving mode of the driver circuitry:
        driving the load via the driver stage in response to an input signal, and
        controlling a power supply to provide a required power supply voltage to the driver stage as a static voltage, while driving the load via the driver stage in response to the input signal;
    determining an impedance of the load;
    determining a minimum power supply voltage required to achieve the predetermined desired voltage headroom in the driver stage, based at least in part on the impedance of the load; and
    determining the required power supply voltage for the driver stage based at least in part on the minimum power supply voltage required to achieve the predetermined desired voltage headroom in the driver stage.

2. The method of claim 1, wherein controlling the power supply to provide the required power supply voltage as a static voltage comprises controlling the power supply independently of magnitude of voltage across the load.

3. The method of claim 1, wherein controlling the power supply to provide the required power supply voltage as a static voltage comprises selecting between a plurality of voltages of the power supply.

4. The method of claim 3, wherein the plurality of voltages of the power supply comprise a plurality of discrete voltages of the power supply.

5. The method of claim 4, wherein the plurality of discrete voltages of the power supply consists of three voltages of the power supply.

6. The method of claim 1, wherein the load is a resistive load.

7. The method of claim 1, further comprising generating the input signal using a digital-analog-converter (DAC).

8. The method of claim 7, further comprising driving the load with a voltage signal, using the driver stage.

9. The method of claim 7, further comprising driving the load with a current signal, using the driver stage.

10. Driver circuitry, comprising:
- a first driver stage configured to drive a load with an unknown impedance magnitude in response to an input generating a voltage headroom signal that represents the difference between peak voltage output and power supply voltage; and
- a controller configured to:
  - determine a required power supply voltage based at least in part on the voltage headroom signal, to achieve at least a predetermined desired voltage headroom in the driver stage, in a configuration mode of the driver, and
  - control a power supply to provide the required power supply voltage to the first driver stage as a static voltage, while the first driver stage drives the load in response to the input signal, in a driving mode of the driver circuitry;
  - determine an impedance of the load;
  - determine a minimum power supply voltage required to achieve the predetermined desired voltage headroom in the driver stage, based at least in part on the impedance of the load; and
  - determine the required power supply voltage for the driver stage based at least in part on the minimum power supply voltage required to achieve the predetermined desired voltage headroom in the driver stage.

11. The driver circuitry of claim 10, wherein the controller is further configured to control the power supply independently of magnitude of voltage across the load.

12. The driver circuitry of claim 10, wherein the controller is further configured to control the power supply to provide the required power supply voltage to the first driver stage as a static voltage by selecting between a plurality of voltages of the power supply.

13. The driver circuitry of claim 12, wherein the plurality of voltages of the power supply comprises a plurality of discrete voltages of the power supply.

14. The method of claim 13, wherein the plurality of discrete voltages of the power supply consist of three voltages of the power supply.

15. The driver circuitry of claim 10, further comprising a digital-analog-converter (DAC) configured to generate the input signal.

16. The driver circuitry of claim 10, wherein the driver circuitry is incorporated within a programmable logic controller (PLC).

* * * * *